United States Patent
Nakamura et al.

(10) Patent No.: US 10,374,388 B2
(45) Date of Patent: Aug. 6, 2019

(54) OPTICAL SEMICONDUCTOR DEVICE

(71) Applicant: Mitsubishi Electric Corporation, Tokyo (JP)

(72) Inventors: Naoki Nakamura, Tokyo (JP); Eiji Nakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/454,202

(22) Filed: Mar. 9, 2017

(65) Prior Publication Data

US 2018/0034238 A1 Feb. 1, 2018

(30) Foreign Application Priority Data

Jul. 28, 2016 (JP) .................................. 2016-148506

(51) Int. Cl.
| | |
|---|---|
| *H01S 5/026* | (2006.01) |
| *H01S 5/042* | (2006.01) |
| *H01S 5/343* | (2006.01) |
| *H01S 5/227* | (2006.01) |

(Continued)

(52) U.S. Cl.
CPC ............ *H01S 5/0421* (2013.01); *H01S 5/026* (2013.01); *H01S 5/2275* (2013.01); *H01S 5/34313* (2013.01); *H01S 5/34326* (2013.01); *H01S 5/1003* (2013.01); *H01S 5/1017* (2013.01); *H01S 5/2031* (2013.01)

(58) Field of Classification Search
CPC ..... H01S 5/1003; H01S 5/1017; H01S 5/2031
See application file for complete search history.

(56) References Cited

U.S. PATENT DOCUMENTS 6,282,219 B1 * 8/2001 Butler ................ G02B 6/12004
372/102
2009/0304326 A1 * 12/2009 Blauvelt ............... G02B 6/132
385/14

(Continued)

FOREIGN PATENT DOCUMENTS

| CN | 102110953 A | 6/2011 |
| JP | Sho62-90969 A | 4/1987 |
| JP | 63-182882 | * 7/1988 |

OTHER PUBLICATIONS

An Office Action issued by Taiwan Patent Office dated Jul. 12, 2018, which corresponds to Taiwanese Patent Application No. 106104854 and is related to U.S. Appl. No. 15/454,202.

(Continued)

*Primary Examiner* — Tod T Van Roy
(74) *Attorney, Agent, or Firm* — Studebaker & Brackett PC

(57) ABSTRACT

An optical semiconductor device includes: an n-type semiconductor substrate; an n-type cladding layer provided on the n-type semiconductor substrate; an active layer of a semiconductor laser provided on the n-type cladding layer; a waveguide layer of a waveguide provided on the n-type cladding layer and having a side facing a side of the active layer; a p-type cladding layer provided on the active layer and the waveguide layer; and a middle layer provided between the side of the active layer and the side of the waveguide layer, provided between the n-type cladding layer and the waveguide layer, not provided on the active layer, and having a band gap greater than a band gap of the waveguide layer.

14 Claims, 11 Drawing Sheets

(51) Int. Cl.
    *H01S 5/10*        (2006.01)
    *H01S 5/20*        (2006.01)

(56) References Cited

U.S. PATENT DOCUMENTS

2011/0002352 A1* 1/2011 Takiguchi .......... G02B 6/12004
                                                    372/46.01
2011/0158279 A1* 6/2011 Sakaino ................ H01S 5/2206
                                                    372/46.01

OTHER PUBLICATIONS

An Office Action mailed by the State Intellectual Property Office of People's Republic of China dated Jan. 4, 2019, which corresponds to Chinese Patent Application No. 201710633483.2 and is related to U.S. Appl. No. 15/454,202.
An Office Action mailed by the Taiwan Intellectual Property Office dated Feb. 23, 2019, which corresponds to Taiwanese Patent Application No. 106104854 and is related to U.S. Appl. No. 15/454,202; with English translation.

* cited by examiner

OPTICAL SEMICONDUCTOR DEVICE

BACKGROUND OF THE INVENTION

Field

The present invention relates to an optical semiconductor device in which a semiconductor laser and a waveguide are integrated monolithically.

Background

In recent years, with an increase of optical communication traffic, various ideas have been made for fast operation of an optical semiconductor device which will be the light source of optical communication. Monolithic integration is one of the ideas. In a conventional device in which a semiconductor laser and a waveguide are integrated monolithically, an active layer of the semiconductor laser and a waveguide layer of the waveguide have been joined directly in a butt joint interface which is a joint portion between them. Therefore, loss of light scattering and loss of mode conversion in the butt joint interface can be suppressed. A device has also been proposed in which a p-type InP middle layer is inserted in a butt joint interface, on an active layer and under a waveguide layer, respectively (for example, see Japanese laid-open patent publication No. S62-90969).

In production of a monolithic integrated device, butt joint growth is used in which numerous devices are integrated by crystal regrowth. In the butt joint interface which is a regrowth interface, there are, in no small quantities, crystal defects caused by contamination during processes, or crystal defects due to a crystal lattice mismatch. Also, a current concentrates in the butt joint interface because of the difference in the energy band structure between the active layer and the waveguide layer. In other words, electrons which flow from a n-type substrate into the waveguide layer, or the hole current which flows from a p-type InP cladding layer into the waveguide layer stay in the butt joint interface, thereby increasing the current density. Therefore, current stress, or heat stress due to heat evolution accompanied thereby is added, causing a stretch of crystal defects to affect reliability of the device.

Further, when the middle layer is used, hole injection into the active layer is inhibited due to a band notch which is generated in the interface between the middle layer on the active layer and the waveguide layer. Carriers which have not been injected into the active layer flow into the waveguide layer, in the form of leak current, resulting in an increase of the current density in the butt joint interface.

SUMMARY

The present invention is made in order to solve the above described problems, whose purpose is to obtain an optical semiconductor device capable of suppressing the current concentration in the butt joint interface to improve reliability.

According to the present invention, an optical semiconductor device includes: an n-type semiconductor substrate; an n-type cladding layer provided on the n-type semiconductor substrate; an active layer of a semiconductor laser provided on the n-type cladding layer; a waveguide layer of a waveguide provided on the n-type cladding layer and having a side facing a side of the active layer; a p-type cladding layer provided on the active layer and the waveguide layer; and a middle layer provided between the side of the active layer and the side of the waveguide layer, provided between the n-type cladding layer and the waveguide layer, not provided on the active layer, and having a band gap greater than a band gap of the waveguide layer.

In the present invention, the middle layer is inserted to cover the side and the bottom of the waveguide layer. This can suppress electrons flowing from the semiconductor substrate into the waveguide layer. Also, because the is not provided on the active layer, hole injection into the active layer is not inhibited. Therefore, the current concentration in the butt joint interface can be suppressed to improve reliability.

Other and further objects, features and advantages of the invention will appear more fully from the following description.

DESCRIPTION OF EMBODIMENTS

An optical semiconductor device according to the embodiments of the present invention will be described with reference to the drawings. The same components will be denoted by the same symbols, and the repeated description thereof may be omitted.

Embodiment 1

Figure 1:
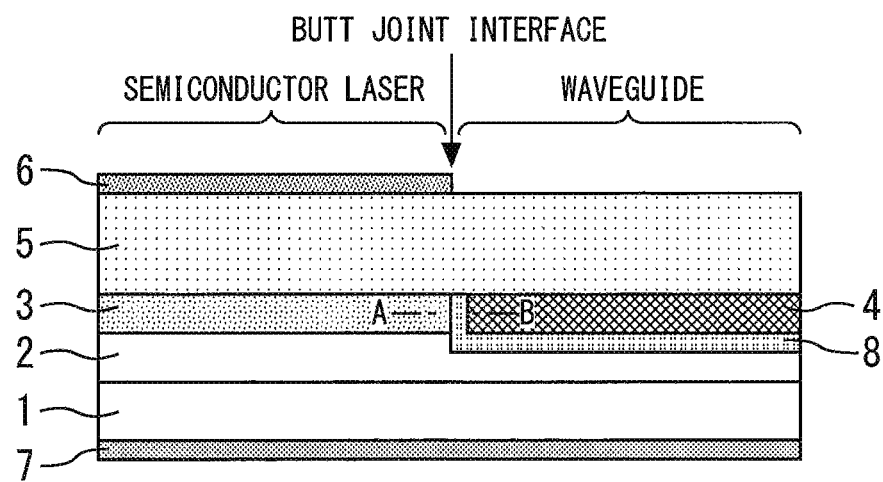
FIG. 1 is a cross sectional view showing an optical semiconductor device according to an embodiment 1 in a light traveling direction.

FIG. 1 is a cross sectional view showing an optical semiconductor device according to an embodiment 1 in a light traveling direction. The left side of the figure shows a semiconductor laser and the right side thereof shows a waveguide. An n-type InP cladding layer 2 is provided on an n-type InP substrate 1. An active layer 3 of the semiconductor laser and a waveguide layer 4 of the waveguide are provided on the n-type InP cladding layer 2. The side of the active layer 3 faces the side of the waveguide layer 4. A joint portion between them is a butt joint interface. A p-type InP cladding layer 5 is provided on the active layer 3 and the waveguide layer 4.

A p-side electrode 6 is provided on the p-type InP cladding layer 5. An n-side electrode 7 is provided under the n-type InP substrate 1. Here, the p-side electrode 6 is provided only on the top of the active layer 3 as a current is injected only to the active layer 3.

An undoped InP middle layer 8 is provided between the side of the active layer 3 and the side of the waveguide layer 4, and between the n-type InP cladding layer 2 and the waveguide layer 4 in an L-shaped manner. Here, the undoped InP middle layer 8 is not provided on the active layer 3. The band gap of the undoped InP middle layer 8 is greater than that of the waveguide layer 4.

Figure 2:
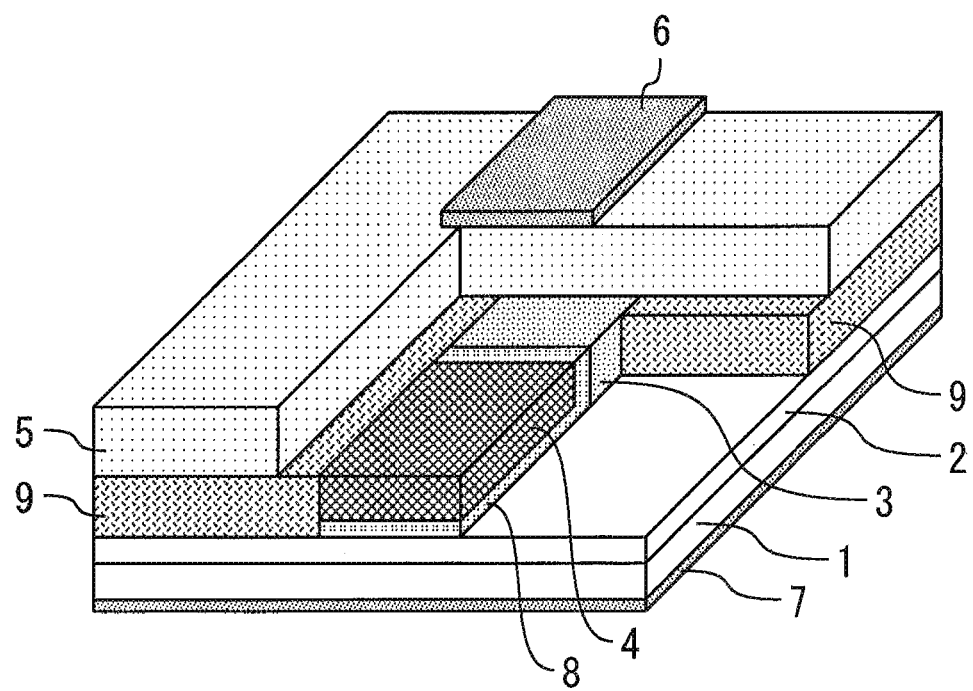
FIG. 2 is a partly cut-out perspective view showing the optical semiconductor device according to the embodiment 1.

FIG. 2 is a partly cut-out perspective view showing the optical semiconductor device according to the embodiment 1. The active layer 3 and the waveguide layer 4 are patterned into stripes, and both sides of them are embedded with a current narrowing layer 9 for narrowing current.

Now, a method for manufacturing the optical semiconductor device according to the present embodiment will be described. FIGS. 3-14 are cross sectional views showing a method for manufacturing the optical semiconductor device according to the embodiment 1. Here, FIGS. 3-8 are cross sectional views in a light traveling direction while FIGS. 9-14 are cross sectional views in a direction perpendicular to the light traveling direction in the semiconductor laser.

Figure 3:
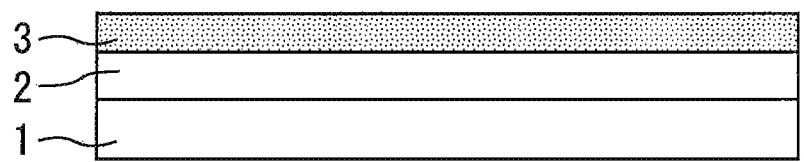
FIGS. 3-14 are cross sectional views showing a method for manufacturing the optical semiconductor device according to the embodiment 1.
Figure 4:
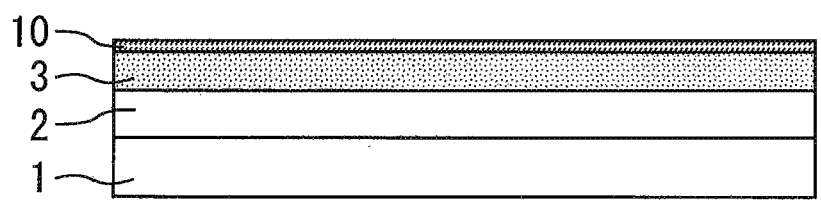
Figure 5:
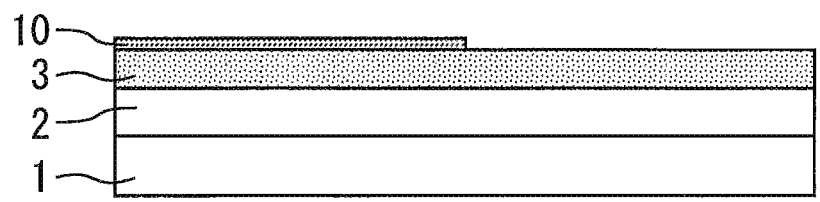

First, as shown in FIG. 3, the n-type InP cladding layer 2 and the active layer 3 are sequentially formed on the n-type InP substrate 1. Next, as shown in FIG. 4, an insulation film 10 is formed on the active layer 3. Then, as shown in FIG. 5, the insulation film 10 is removed except a portion to be the semiconductor laser.

Figure 6:
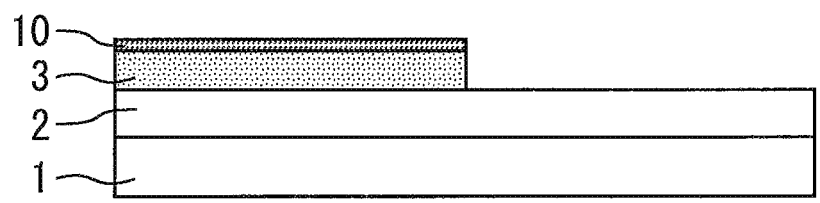
Figure 7:
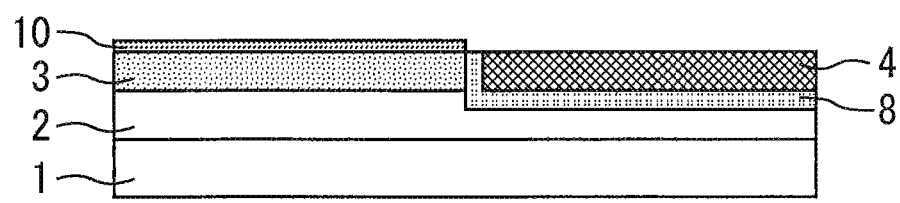
Figure 8:
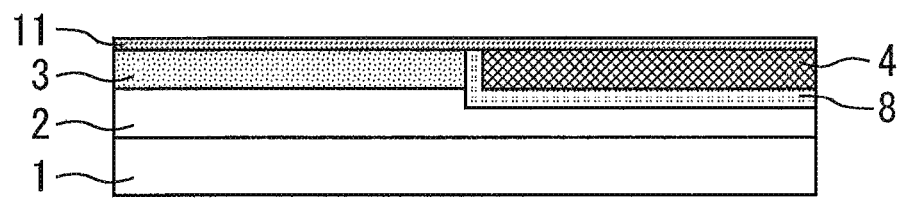
Figure 9:
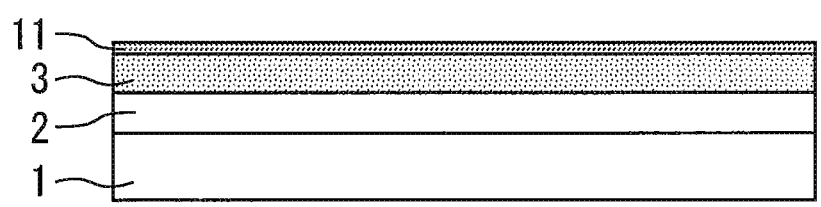

Next, as shown in FIG. 6, the active layer 3 is etched, using the patterned insulation film 10 as a mask. Subsequently, as shown in FIG. 7, the undoped InP middle layer 8 and the waveguide layer 4 are sequentially formed by MOCVD, using this insulation film 10 as a selective growth mask. Thereafter, the insulation film 10 is removed by buffered hydrofluoric acid and the like. Next, as shown in FIGS. 8 and 9, the insulation film 11 is formed. A semiconductor wafer manufactured as above is processed as follows through normal wafer processes.

Figure 10:
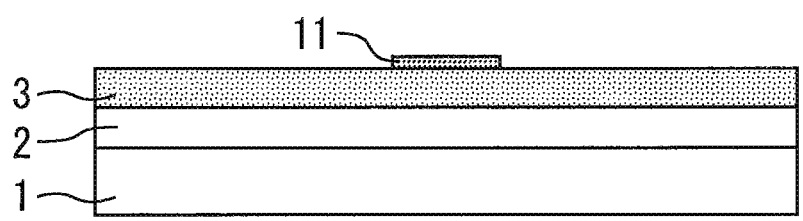
Figure 11:
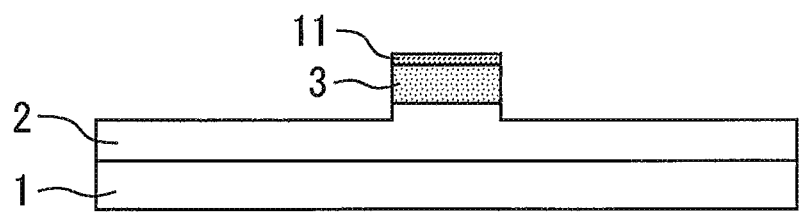
Figure 12:
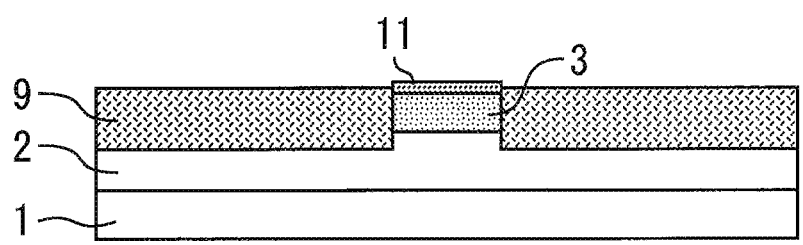

Next, as shown in FIG. 10, the insulation film 11 is patterned into a stripe. Then, as shown in FIG. 11, the active layer 3, the waveguide layer 4 and the undoped InP middle layer 8 are etched using the stripe-like insulation film 11 as a mask. Subsequently, as shown in FIG. 12, the current narrowing layer 9 is formed by MOCVD, using the stripe-like insulation film 11 as a selective growth mask. Thereafter, the insulation film 11 is removed by buffered hydrofluoric acid and the like.

Figure 13:
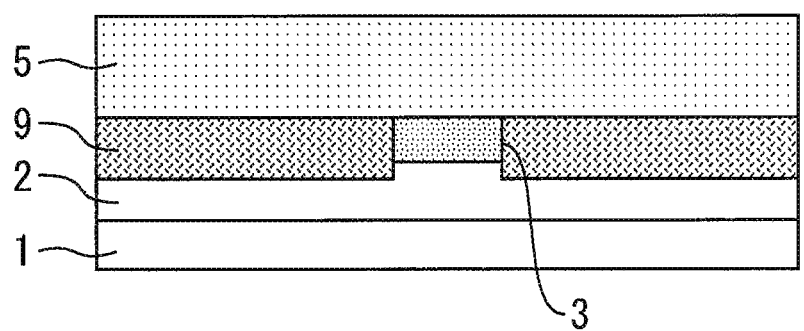
Figure 14:
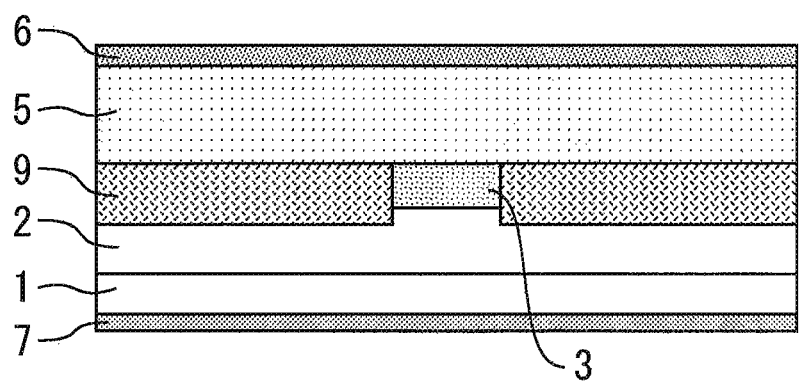

Subsequently, as shown in FIG. 13, the p-type InP cladding layer 5 is formed by MOCVD. Next, the p-side electrode 6 and the n-side electrode 7 are formed as shown in FIGS. 1 and 14. An optical integrated device having a waveguide is manufactured by the above processes.

Figure 15:
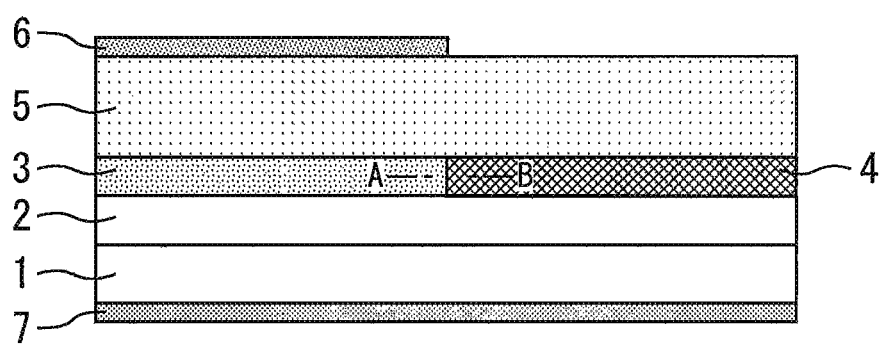
FIG. 15 is a view showing an optical semiconductor device according to a comparative embodiment 1.
Figure 16:
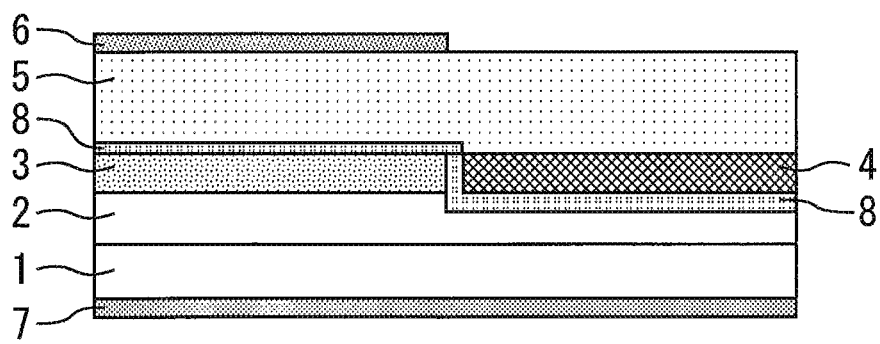
FIG. 16 is a view showing an optical semiconductor device according to a comparative embodiment 2.

Now, the effect of the present embodiment will be explained as compared with comparative embodiments 1, 2. FIG. 15 is a view showing an optical semiconductor device according to a comparative embodiment 1. FIG. 16 is a view showing an optical semiconductor device according to a comparative embodiment 2. The comparative embodiment 1 has no undoped InP middle layer 8. The comparative embodiment 2 has the undoped InP middle layer 8 provided also on the active layer 3.

Figure 17:
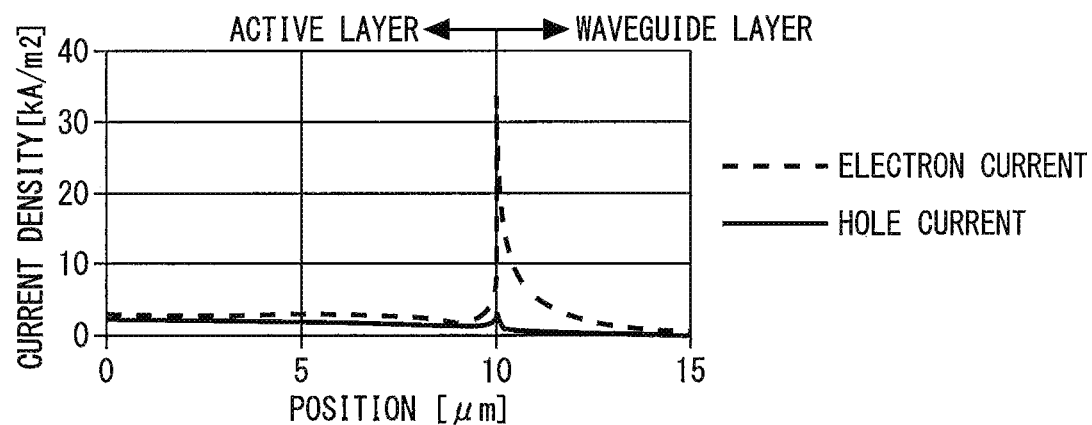
FIG. 17 is a view showing a simulation result of a current density in a butt joint interface of the comparative embodiment 1.
Figure 18:
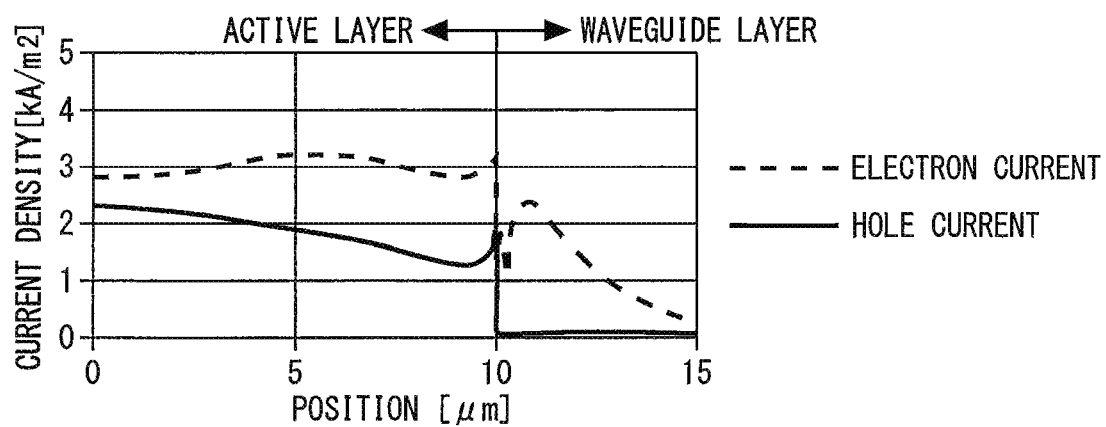
FIG. 18 is a view showing a simulation result of a current density in a butt joint interface of the embodiment 1.
Figure 19:
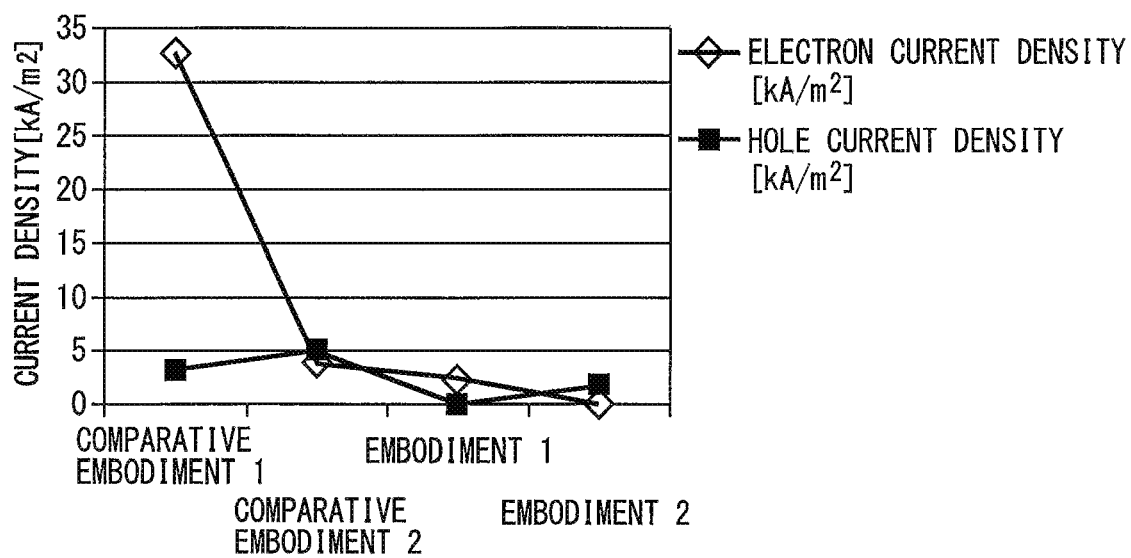
FIG. 19 is a view in which the maximum current density of the hole current and that of the electron current in the waveguide layer is plotted.

FIG. 17 is a view showing a simulation result of a current density in a butt joint interface of the comparative embodiment 1. FIG. 18 is a view showing a simulation result of a current density in a butt joint interface of the embodiment 1. Abscissas represent positions in A-B of FIG. 1 or 15 while ordinates represent the current density of a hole current and an electron current. The film thickness of the undoped InP middle layer 8 which was inserted to the butt joint interface between the active layer 3 and the waveguide layer 4 was set to 200 nm. FIG. 19 is a view in which the maximum current density of the hole current and that of the electron current in the waveguide layer is plotted. AlGaInAs was designated as the active layer 3 and InGaAsp was designated as the waveguide layer 4 to perform simulation.

The active layer 3 has a multiquantum well structure, and the waveguide layer 4 has a bulk structure which has a larger band gap than an effective band gap of the multiquantum well structure of the active layer 3. For this reason, band discontinuity is generated in the butt joint interface in which they joined. Therefore, when carriers flow into the waveguide layer 4, the carriers concentrate in the butt joint interface. Meanwhile, the similar event can occur even when the waveguide layer 4 is constructed by a multiquantum well structure which has a larger band gap than that of the multiquantum well structure of the active layer 3.

In the comparative embodiment 1, the electron current density of the waveguide layer 4 side mainly reaches approximately 10 times of that of the active layer 3 side, resulting in very high current concentration in the butt joint interface at the waveguide layer 4 side. In the comparative embodiment 2, hole injection into the active layer 3 is inhibited, thereby increasing the current density in the butt joint interface.

On the other hand, in the embodiment 1, the undoped InP middle layer 8 has been inserted so as to cover the side and the bottom of the waveguide layer 4 in the L-shaped manner. This can suppress electrons flowing from the n-type InP substrate 1 into the waveguide layer 4. Also, because the undoped InP middle layer 8 is not provided on the active layer 3, hole injection into the active layer 3 is not inhibited. Therefore, the current concentration in the butt joint interface can be suppressed to improve reliability.

Embodiment 2

Figure 20:
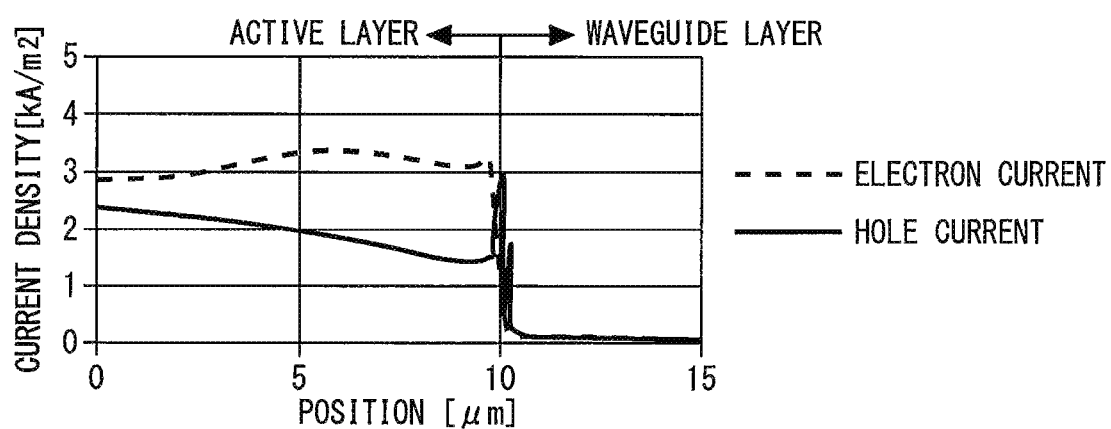
FIG. 20 is a view showing a simulation result of a current density in a butt joint interface of the embodiment 2.

In a present embodiment, a p-type InP layer is used as the middle layer instead of the undoped InP middle layer 8. FIG. 20 is a view showing a simulation result of a current density in a butt joint interface of the embodiment 2. As shown in FIGS. 19 and 20, the present embodiment can more suppress the current density of the waveguide layer 4 side in the interface than the comparative embodiments, and can more suppress electrons flowing into the waveguide layer 4 than the embodiment 1.

Embodiment 3

Figure 21:
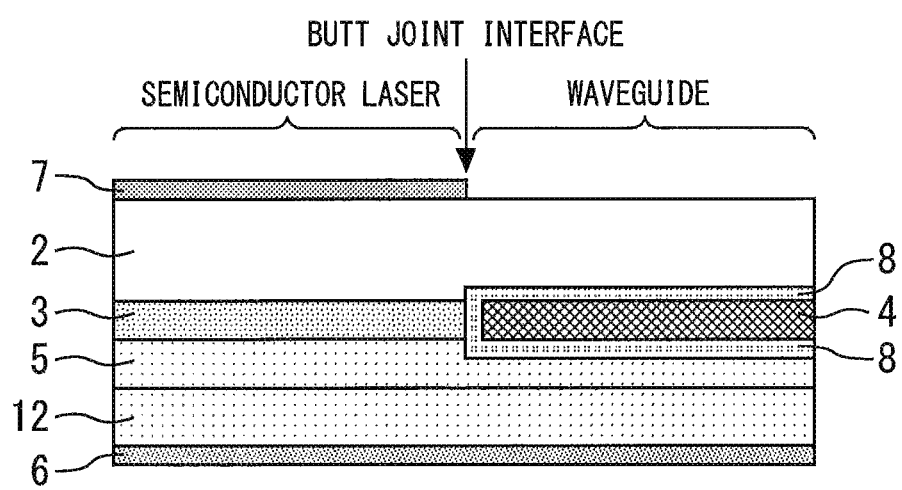
FIG. 21 is a cross sectional view showing an optical semiconductor device according to an embodiment 3 in a light traveling direction.

FIG. 21 is a cross sectional view showing an optical semiconductor device according to an embodiment 3 in a light traveling direction. The left side of the figure shows a semiconductor laser and the right side thereof shows a waveguide. While the n-type InP substrate 1 was used in the embodiments 1 and 2, a p-type semiconductor substrate 12 is used in the present embodiment.

The p-type InP cladding layer 5 is provided on the p-type semiconductor substrate 12. The active layer 3 of the semiconductor laser and the waveguide layer 4 of the waveguide are provided on the p-type InP cladding layer 5. The side of the active layer 3 faces the side of the waveguide layer 4 of the waveguide. The n-type InP cladding layer 2 is provided on the active layer 3 and the waveguide layer 4.

The n-side electrode 7 is provided on the n-type InP cladding layer 2. The p-side electrode 6 is provided under the p-type semiconductor substrate 12. Here, the n-side electrode 7 is provided only on the top of the active layer 3 because a current is injected only to the active layer 3.

The undoped InP middle layer 8 is provided between the side of the active layer 3 and the side of the waveguide layer 4, between the p-type InP cladding layer 5 and the waveguide layer 4, and between the n-type InP cladding layer 2 and the waveguide layer 4. Here, the undoped InP middle layer 8 is not provided under the active layer 3. The band gap of the undoped InP middle layer 8 is greater than that of the waveguide layer 4. Meanwhile, a p-type InP layer may be used as the middle layer instead of the undoped InP middle layer 8.

When the undoped InP middle layer 8 is thus inserted between the n-type InP cladding layer 2 and the waveguide layer 4, an electron current flowing from the n-type InP cladding layer 2 into the waveguide layer 4 can be suppressed. Also, because the undoped InP middle layer 8 is not provided under the active layer 3, hole injection into the active layer 3 is not inhibited. Therefore, even when the p-type semiconductor substrate 12 is used, the polarity is reversed though, the current concentration in the butt joint interface can be suppressed to improve reliability, as in the embodiment 1.

Meanwhile, in the embodiments 1-3, an undoped or a p-type AlGaInAs layer or InGaAsP layer may be used as the middle layer instead of the undoped InP middle layer 8 and the p-type InP layer. However, in any case, the band gap of the middle layer is set so as to be larger than the band gap of the waveguide layer 4. This allows the middle layer to be a barrier layer in order to suppress an electron current flowing from the n-type layer into the waveguide layer 4.

Also, in the embodiments 1-3, the active layer 3 and the waveguide layer 4 may be InGaAsP or AlGaInAs. Not only the waveguide, but also a semiconductor amplifier or a semiconductor modulator may be integrated monolithically.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-148506, filed on Jul. 28, 2016 including specification, claims, drawings and summary, on which the Convention priority of the present application is based, is incorporated herein by reference in its entirety.

The invention claimed is:

1. An optical semiconductor device comprising:
an n-type semiconductor substrate;
an n-type cladding layer provided on the n-type semiconductor substrate;
an active layer of a semiconductor laser provided on the n-type cladding layer, the active layer having an uppermost side;
a waveguide layer of a waveguide provided on the n-type cladding layer, the waveguide layer having a side facing a side of the active layer and having an uppermost side aligned with the uppermost side of the active layer;
a p-type cladding layer provided on the active layer and the waveguide layer; and
a middle layer provided between the side of the active layer and the side of the waveguide layer, provided between the n-type cladding layer and the waveguide layer, not provided on the active layer, and having a band gap greater than a band gap of the waveguide layer, the middle layer including a first side and a second side opposing the first side, the first and second sides facing the n-type cladding layer and the p-type cladding layer, respectively, and the second side aligned with the uppermost side of the active layer and aligned with the uppermost side of the waveguide layer.

2. The optical semiconductor device according to claim 1, wherein the active layer has a multiquantum well structure and the waveguide layer has a bulk structure or a multiquantum well structure.

3. The optical semiconductor device according to claim 1, wherein the middle layer is undoped or p-type.

4. The optical semiconductor device according to claim 1, wherein the middle layer is InP, AlGaInAs or InGaAsP.

5. The optical semiconductor device according to claim 1, wherein the active layer and the waveguide layer are InGaAsP or AlGaInAs.

6. The optical semiconductor device according to claim 1, wherein the p-type cladding layer is provided on the active layer and the waveguide layer on an opposite side of the active layer and the waveguide layer from the n-type cladding layer.

7. The optical semiconductor device according to claim 1, wherein the active layer and the waveguide layer extend along a same surface of the p-type cladding layer.

8. An optical semiconductor device comprising:
a p-type semiconductor substrate;
a p-type cladding layer provided on the p-type semiconductor substrate;
an active layer of a semiconductor laser provided on the p-type cladding layer, the active layer having an uppermost side;
a waveguide layer of a waveguide provided on the p-type cladding layer, the waveguide layer having a side facing a side of the active layer and having an uppermost side aligned with the uppermost side of the active layer;
an n-type cladding layer provided on the active layer and the waveguide layer; and
a middle layer provided entirely between the side of the active layer and the side of the waveguide layer, provided entirely between the p-type cladding layer and the waveguide layer, provided entirely between the waveguide layer and the n-type cladding layer, not provided under the active layer, and having a band gap greater than a band gap of the waveguide layer, the middle layer including a first side and a second side opposing the first side, the first and second sides facing the n-type cladding layer and the p-type cladding layer, respectively.

9. The optical semiconductor device according to claim 8, wherein the active layer has a multiquantum well structure and the waveguide layer has a bulk structure or a multiquantum well structure.

10. The optical semiconductor device according to claim 8, wherein the middle layer is undoped or p-type.

11. The optical semiconductor device according to claim 8, wherein the middle layer is InP, AlGaInAs or InGaAsP.

12. The optical semiconductor device according to claim 8, wherein the active layer and the waveguide layer are InGaAsP or AlGaInAs.

13. The optical semiconductor device according to claim 8, wherein the n-type cladding layer is provided on the active layer and the waveguide layer on an opposite side of the active layer and the waveguide layer from the p-type cladding layer.

14. The optical semiconductor device according to claim 8, wherein the active layer and the waveguide layer extend along a same surface of the n-type cladding layer.

* * * * *